United States Patent
Um

(10) Patent No.: US 8,585,823 B2
(45) Date of Patent: Nov. 19, 2013

(54) CVD APPARATUS HAVING A ROTATING HEATER

(75) Inventor: Pyung-yong Um, Yongin (KR)

(73) Assignee: Eugene Technology Co., Ltd., Yongin (KR)

( * ) Notice: Subject to any disclaimer, the term of this patent is extended or adjusted under 35 U.S.C. 154(b) by 1429 days.

(21) Appl. No.: 11/993,128

(22) PCT Filed: Jun. 23, 2006

(86) PCT No.: PCT/KR2006/002445
§ 371 (c)(1),
(2), (4) Date: Dec. 19, 2007

(87) PCT Pub. No.: WO2006/137719
PCT Pub. Date: Dec. 28, 2006

(65) Prior Publication Data
US 2010/0227057 A1 Sep. 9, 2010

(30) Foreign Application Priority Data

Jun. 24, 2005 (KR) ........................ 10-2005-0054888

(51) Int. Cl.
*B05C 13/02* (2006.01)
*B05C 21/00* (2006.01)
*C23C 16/00* (2006.01)

(52) U.S. Cl.
USPC ........... 118/725; 118/728; 118/729; 118/730; 118/500

(58) Field of Classification Search
USPC ...................................................... 118/725
See application file for complete search history.

(56) References Cited

U.S. PATENT DOCUMENTS 5,421,893 A * 6/1995 Perlov .......................... 118/725

FOREIGN PATENT DOCUMENTS

| JP | 05-044038 | | 2/1993 |
|----|-----------|---|--------|
| JP | 06-318630 | A | 11/1994 |
| JP | 07-1142396 | | 6/1995 |
| JP | 2000-096242 | | 4/2000 |
| JP | 2001-512789 | (T) | 8/2001 |
| JP | 2003-133233 | A | 5/2003 |
| KR | 10-2004-0092847 | A | 11/2004 |
| KR | 10-2005-0018042 | A | 2/2005 |

OTHER PUBLICATIONS

X-Rings/Quad-Rings, Marco Rubber & Plastic Products, Inc., http://marcorubber.com, Dec. 2001.*
International Search Report dated Oct. 10, 2006.

* cited by examiner

*Primary Examiner* — Dah-Wei Yuan
*Assistant Examiner* — Stephen Kitt
(74) *Attorney, Agent, or Firm* — KED & Associates LLP

(57) ABSTRACT

The present invention relates to a chemical vapor deposition (CVD) apparatus which has rotation type heater. Particularly, the inventive CVD apparatus has advantageous effects in that it includes a motor for rotating the heater and a position sensor assembly for detecting the orientational position of the heater, so that the thickness of a thin film being deposited on a wafer can be made uniform through the rotation of the heater upon the deposition in spite of uneven introduction of a reaction gas into a reaction chamber, and the orientational positions of the wafer at the start and the end of the deposition process which are identical to each other can be secured to thereby orient the wafer in a predetermined direction on the heater.

12 Claims, 8 Drawing Sheets

CVD APPARATUS HAVING A ROTATING HEATER

TECHNICAL FIELD

The present invention relates generally to a chemical vapor deposition (CVD) apparatus which has rotation type heater, and more particularly, to such a CVD apparatus including a motor for rotating the rotation-type heater and a position sensor assembly for detecting the position of the heater so that a uniform deposition thickness is produced on a wafer through the rotation of the heater upon the deposition of a thin film on the wafer.

BACKGROUND ART

In general, a method of forming a thin film on a wafer is classified into a physical vapor deposition (PVD) method employing a physical collision between particles such as a sputtering method and a chemical vapor deposition (CVD) method of forming the thin film on the wafer using a chemical reaction. The CVD method is more widely used since it is relatively excellent in terms of the uniformity of thin-film thickness and step coverage characteristics of the thin film as compared to the PVD method.

Now, a conventional CVD apparatus will be described hereinafter with reference to FIG. 1.

Referring to FIG. 1, the conventional CVD apparatus includes a chamber C where a deposition space of a wafer W is provided, a shower head for injecting a reaction gas into the chamber, and a heater H disposed within the chamber for heating the wafer W seated thereon so as to allow a thin film to be deposited on the wafer.

In case where a thin film is deposited on the wafer W, the heater H ascends. To this end, the heater H is raised and lowered, i.e., moved upwardly and downwardly by means of a feeding portion 30 having a feed screw.

Under the above construction, a thin film is deposited on the wafer W seated on the ascended heater H by means of a chemical reaction using a reaction gas.

However, in the CVD method, there has also occurred a problem in that when the flow of the reaction gas is in an unbalanced state within the reaction chamber, the thickness of the thin film being deposited on the wafer varies depending on respective positions over the whole surface of the wafer W, which leads to the formation of the thin film having uneven thickness over the whole wafer surface.

DISCLOSURE OF INVENTION

Technical Problem

Accordingly, the present invention has been made to solve the above problems occurring in the prior art, and it is an object of the present invention to provide a chemical vapor deposition (CVD) apparatus which allows the thickness of a thin film being deposited on a wafer to be evenly produced through the rotation of a heater upon the deposition in spite of uneven flow of a reaction gas inside a reaction chamber.

Technical Solution

The above object is accomplished by a chemical vapor deposition (CVD) apparatus comprising a heater-rotating portion which includes a motor for generating a rotational force to rotate a rotation-type heater, a rotational shaft for transferring the rotational force generated from the motor, and a rotational stand mounted on the top end of the rotational shaft for receiving the rotational force from the rotational shaft to rotate the heater.

Advantageous Effects

As described above, the inventive chemical vapor deposition (CVD) apparatus has advantageous effects in that it includes a motor for rotating the heater and a position sensor assembly for detecting the orientational position of the heater, so that the thickness of a thin film being deposited on a wafer can be made uniform through the rotation of the heater upon the deposition in spite of uneven introduction of a reaction gas into a reaction chamber, and the orientational positions of the wafer at the start and the end of the deposition process which are identical to each other can be secured.

Further, the orientational positions of the wafer are identical to each other at the start and the end of the deposition process to thereby orient the wafer in a predetermined direction on the heater.

MODE FOR THE INVENTION

Hereinafter, the present invention will be described in detail with reference to the accompanying drawings.

Figure 1:
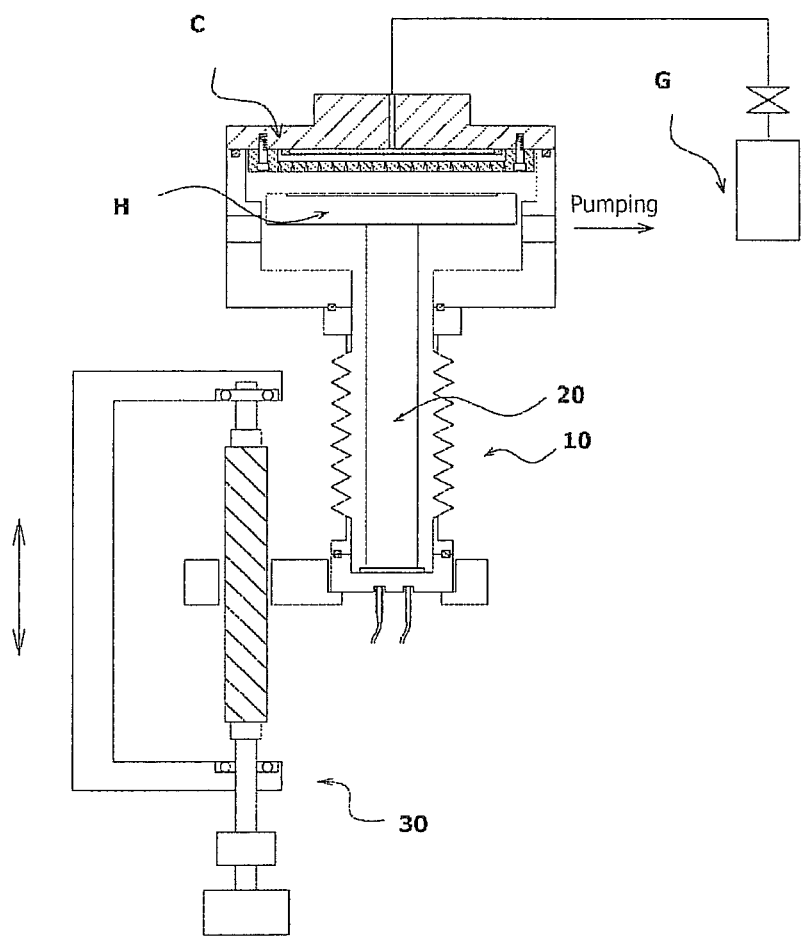
FIG. 1 is a conceptual view illustrating a conventional chemical vapor deposition (CVD) apparatus according to the prior art.
Figure 2:
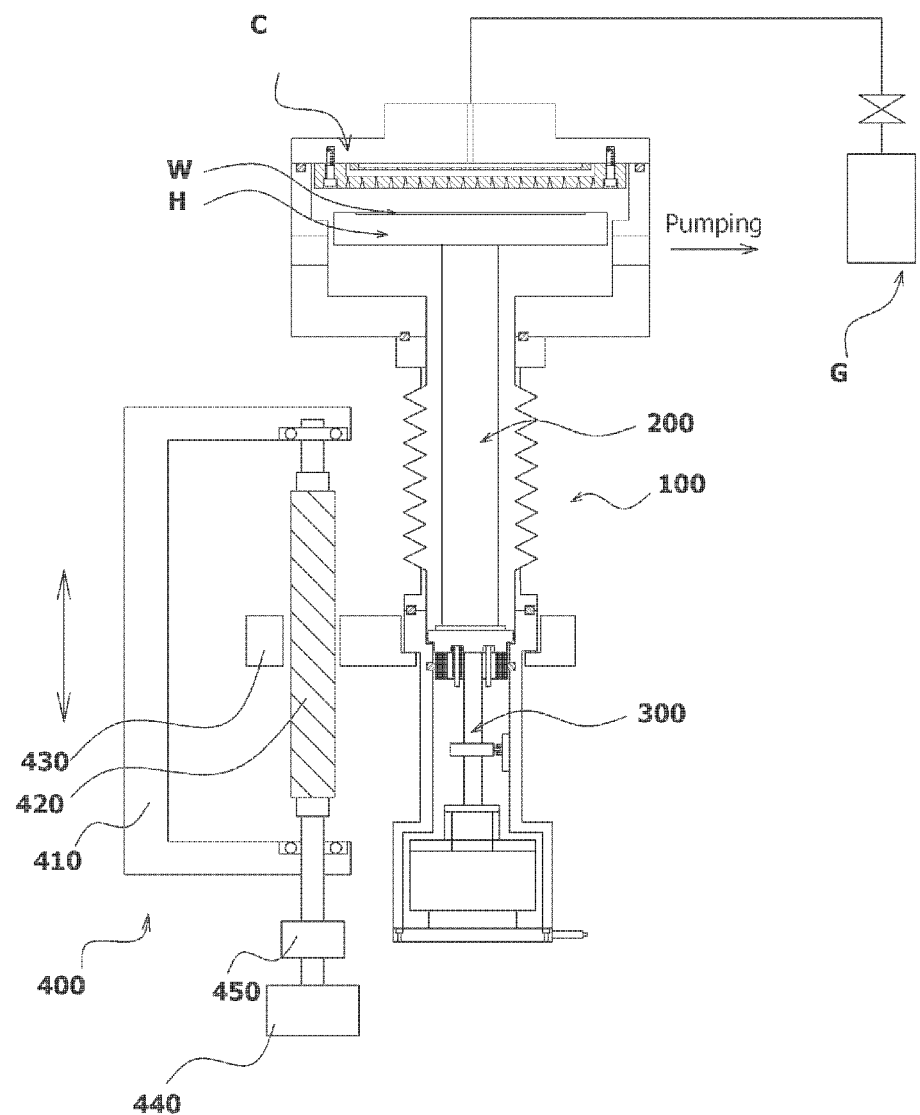
FIG. 2 is a conceptual view illustrating a chemical vapor deposition (CVD) apparatus according to the present invention.

The present invention is directed to a CVD apparatus which allows the thickness of a thin film being deposited on a wafer to be evenly produced upon the deposition in spite of uneven flow of a reaction gas inside a reaction chamber. As shown in FIG. 2, the inventive CVD apparatus includes a reaction chamber C where a deposition space of a wafer W is provided, a heater H disposed within the reaction chamber C for heating a wafer W seated thereon, a heater-supporting portion 200 for supporting the heater H, a chamber-supporting portion 100 for supporting the reaction chamber C, a heater-rotating portion 300 connected to a lower end portion of the heater-supporting portion 200 for rotating the heater H, and a feeding portion 400 for allowing the heater H to ascend and descend.

The feeding portion 400 includes a feed motor 440 for generating a rotational force, a feed screw 420 and a feed plate 430 that are connected to the feed motor 440 for receiving the rotational force from feed motor to convert the rotational force into a force to move upwardly and downwardly, and a holder 410 for securely fixing the feed screw 420.

Now, the chamber-supporting portion 100 of the CVD apparatus according to the present invention will be described hereinafter with reference to FIG. 3.

Figure 3:
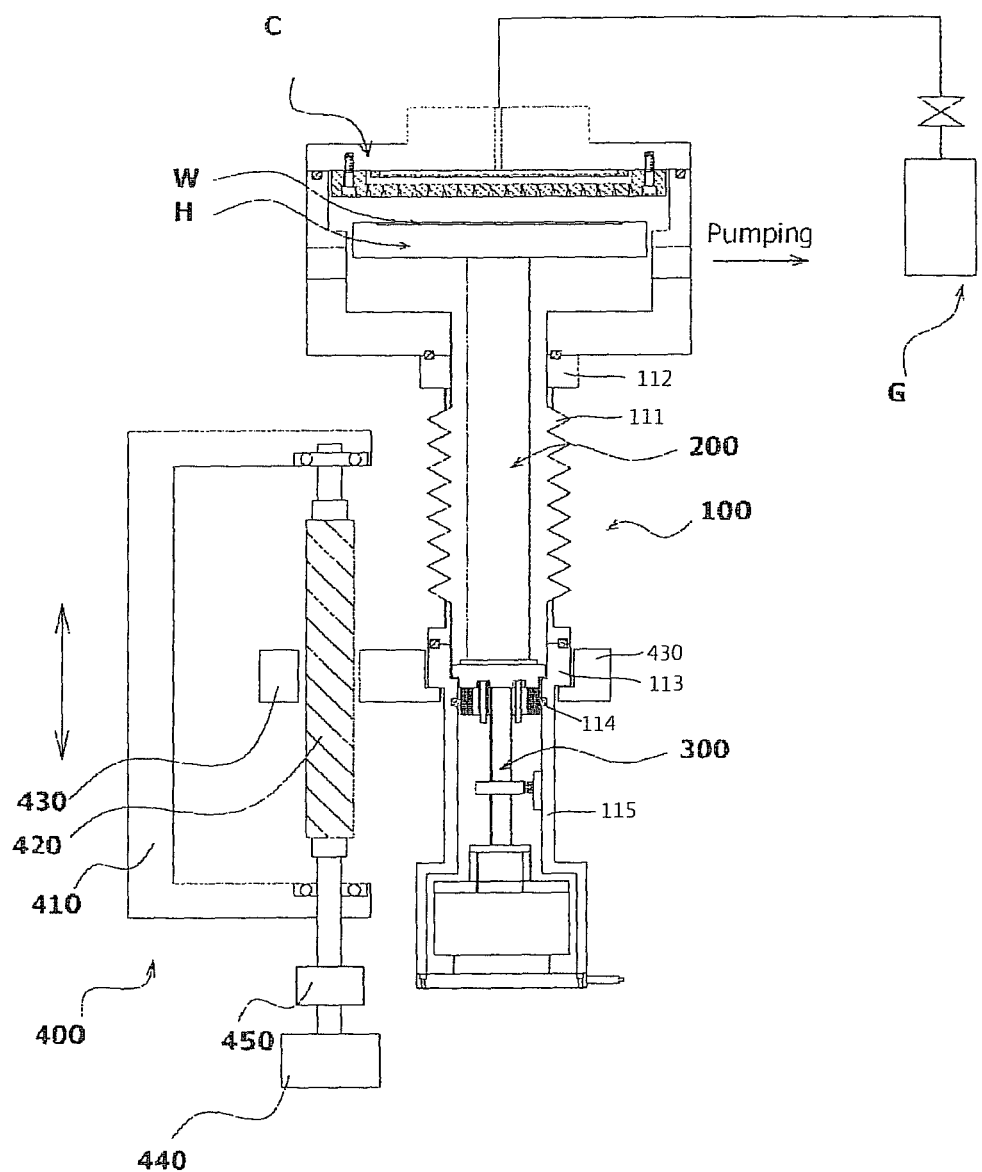
FIG. 3 is a conceptual view illustrating a chamber supporting portion of the CVD apparatus according to the present invention.

In FIG. 3, only the construction of the chamber-supporting portion 100 is shown, but other constitutional elements are omitted for the convenience of explanation.

Referring to FIG. 3, the chamber-supporting portion 100 serves to support the reaction chamber C, and a connecting portion 112 is disposed at a bottom end surface of the reaction chamber C. Between the reaction chamber C and the connecting portion 112 is disposed a sealing member (shown, but not denoted by a reference numeral) using an O-ring.

At a lower portion of the connecting portion 112 is provided a bellows 111 adapted to be elastically length-adjusted correspondingly to a variation in the vertical moving length of the heater depending on the raising and lowering of the heater H. At a bottom surface of the bellows 111 is provided a seating portion 113 so as to be retained in the feed plate 430 of the feeding portion 400 (see FIG. 2).

A lower support 115 is disposed at a bottom surface of the seating portion 113.

An air-tight sealing member 114 is disposed at the inner peripheral wall of the lower support 115 so as to come into close contact with the outer peripheral surface of the rotation seal shaft to thereby maintain air-tightness, which will be described later.

At this time, an O-ring may be used as the air-tight sealing member 114.

A deposition process is performed at the inside of the reaction chamber C under the above construction of the air-tight sealing member 114.

Figure 4:
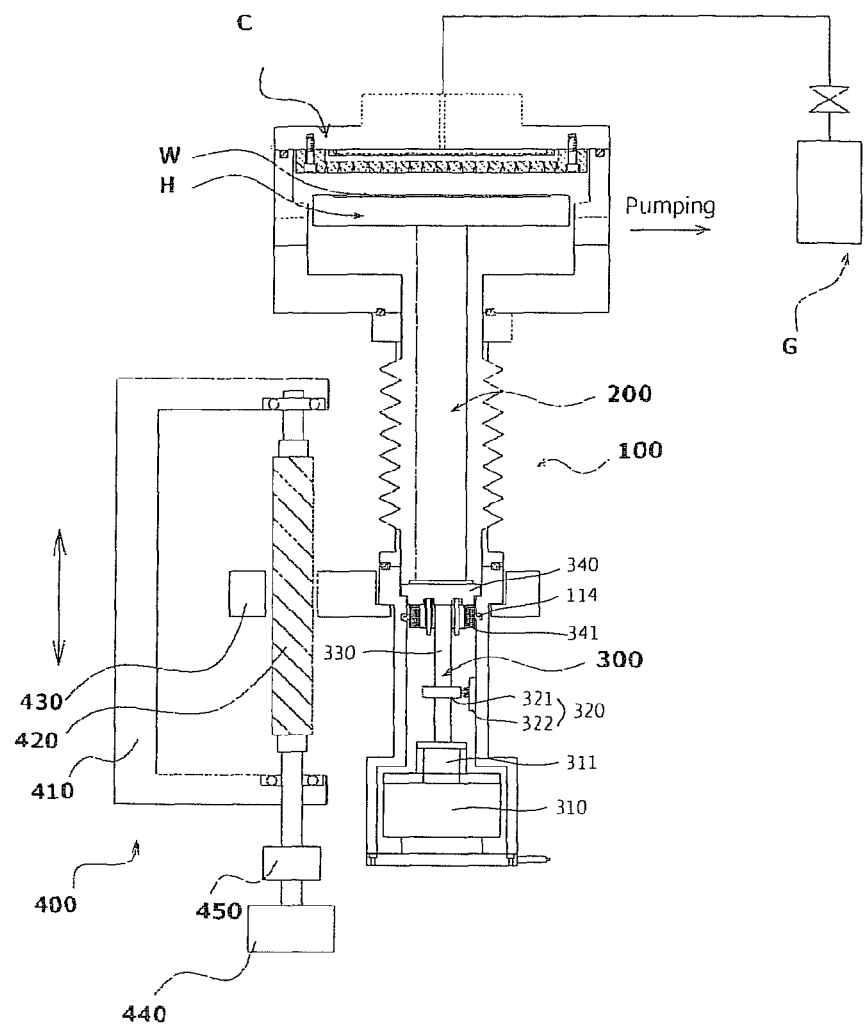
FIG. 4 is a conceptual view illustrating a heater rotating portion of the CVD apparatus according to the present invention.

Among the reaction chamber C, the heater H disposed within the reaction chamber C, the heater-supporting portion 200 for supporting the heater H, the chamber-supporting portion 100 for supporting the reaction chamber C, the heater-rotating portion 300 for rotating the heater H, and the feeding portion 400 for allowing the heater H to ascend and descend as described above, the heater-rotating portion 300 will be described hereinafter with reference to FIG. 4.

First, the heater-rotating portion 300 includes a motor 310 for supplying a rotational force to the heater H to rotate the heater H. A controllable servo-motor is used as the motor 310 to stop the operation of the heater H at a certain position as described below.

The rotational force from the motor 310 is transferred to the rotational shaft 330, and then to the rotational stand 340 so as to cause the heater-supporting portion 200 fixedly mounted on the rotational stand 340 to thereby rotate the heater H.

At this time, a connecting member 311 such as a coupling or a flange is preferably mounted between the rotational shaft 330 and the motor 310.

In the meantime, the rotation seal shaft 341 is mounted at a bottom surface of the rotational stand 340 so as to come into close contact with the air-tight sealing member 114 to maintain air-tightness.

The air-tight sealing member 114 will be described hereinafter with reference to FIGS. 5 and 6.

Figure 5:
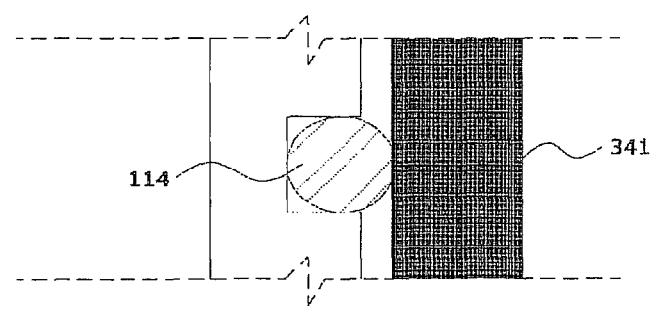
FIGS. 5 and 6 are conceptual views illustrating a sealing member according to the present invention.

As shown in FIG. 5, a typical O-ring as the air-tight sealing member 114 is in close contact with the rotation seal shaft 341.

However, in case where the O-ring generally comes into close contact with a rotating body, there may occur a problem associated with durability due to a relatively large contact area thereof as compared to a contact area of the rotating body.

Figure 6:
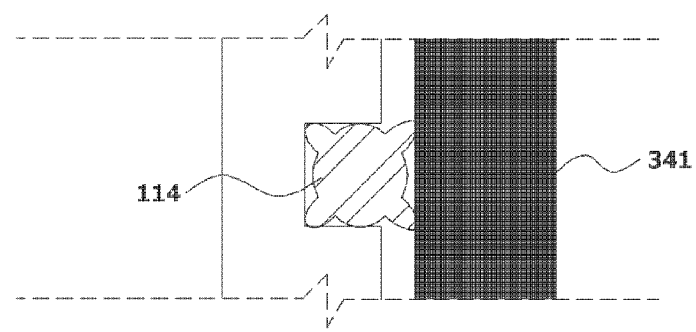

To overcome the above problem, as shown in FIG. 6, a quad ring is preferably used instead of the O-ring.

The quad ring has a smaller contact area than that of the O-ring to produce a relatively small friction force, thereby leading to an increase in abrasion resistance.

Now, the rotation seal shaft 341 with which the air-tight sealing member 114 comes into close contact will be described hereinafter with reference to FIG. 7.

Figure 7:
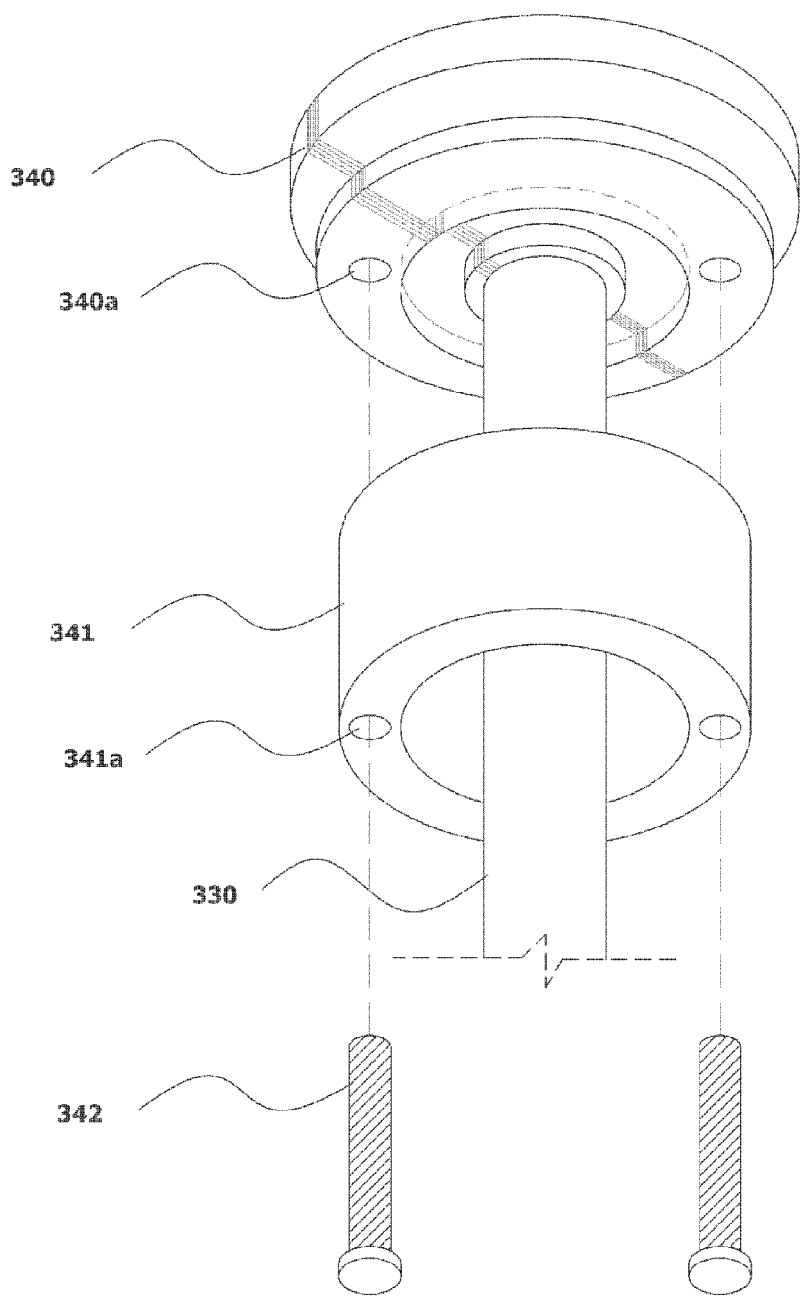
FIG. 7 is an enlarged perspective view illustrating a rotational sealing shaft of the CVD apparatus according to the present invention.

As shown in FIG. 7, the rotation seal shaft 341 is formed in a cylindrical shape so that it is hollowed internally to allow the rotational shaft 330 to be inserted therethrough. Also, the rotational shaft 341 is penetratingly formed therein with fastening holes 341a for allowing fastening elements 342 to be inserted therethrough.

Accordingly, the fastening elements 342 pass through fastening holes 340a formed penetratingly inside the rotational stand 340 via the fastening holes 341a of the rotation seal shaft 341 so that the rotation seal shaft 341 is securely fixed to the rotational stand 340.

Under the above construction, when the rotational shaft 330 rotates by the driving force of the motor 310, the rotational stand 340 rotates. At this time, the rotation seal shaft 341 also rotate along with the rotational stand 340 in a state where it is securely fixed to the rotational stand 340 while coming into close contact with the air-tight sealing member 114. In addition, the rotation seal shaft 341 rotates with it abutted against the air-tight sealing member 114 to thereby maintain air-tightness.

In the meantime, the rotation seal shaft 341 is preferably made of any one selected from the group consisting of Polytetrafluoroethylene (PTFE), Polyetheretherketone (PEEK), stainless steel, and aluminum.

The Polytetrafluoroethylene (PTFE) is suitable for a material of the rotation seal shaft 341 of the present invention since it is fluororesin, i.e., a plastic containing fluorine, which has chemical properties of excellent durability.

Further, the Polyetheretherketone (PEEK), i.e., amorphous resin which is not soluable in a typical solvent is a material having an excellent abrasion resistance and a self-lubrication property. The Polyetheretherketone (PEEK) is also suitable for a material of the rotation seal shaft 341 according to the present invention.

In addition, since stainless steel or aluminum is also excellent in abrasion resistance, it may be used as a material of the rotation seal shaft 341 of the present invention.

In the meantime, as described above, during the deposition process of the present invention, the heater H rotates. At this time, the position of the heater H is important at the start and the end of the deposition process. The reason for this is that the wafer W is oriented in a predetermined direction on the heater H.

That is, it is required that the orientational positions of the wafer W at the start and the end of the deposition process should be identical to each other. To this end, the requirement is satisfied by a position sensor assembly 320.

The position sensor assembly 320 will now be described hereinafter with reference to FIG. 8.

Figure 8:
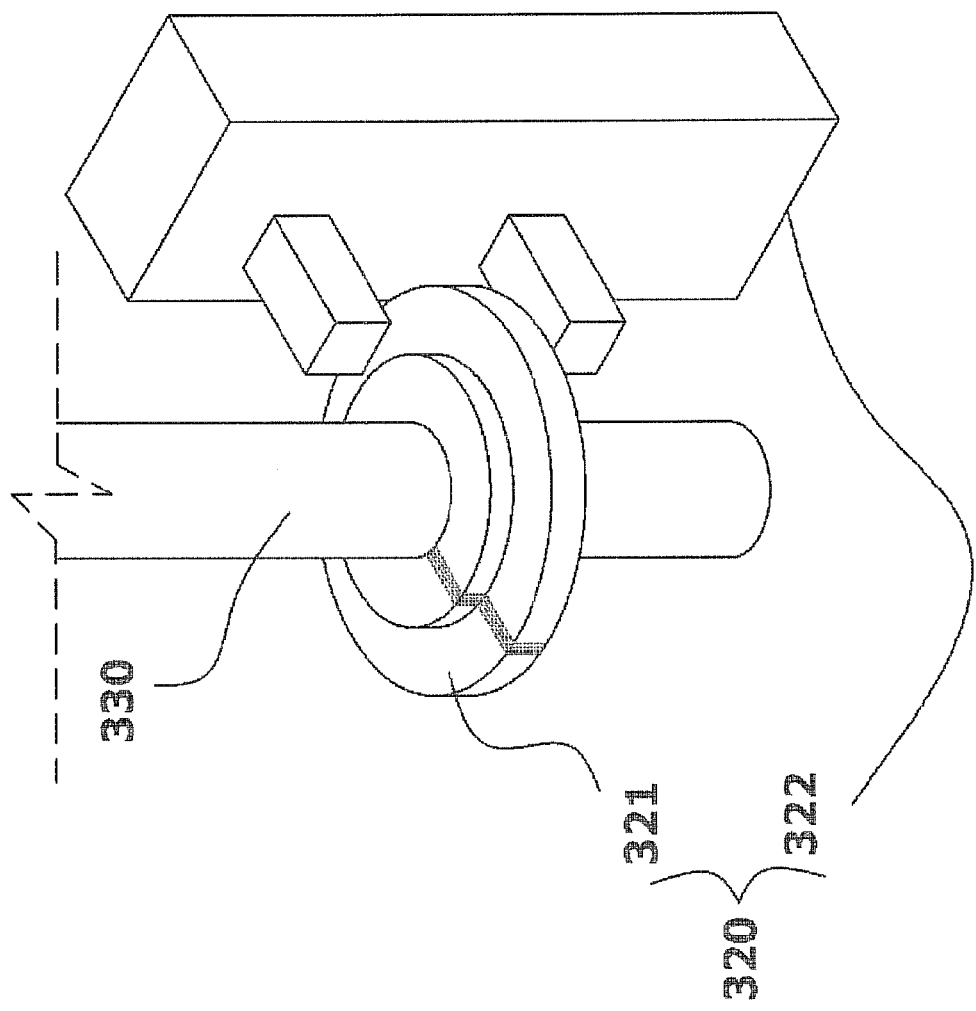
FIG. 8 is an enlarged perspective view illustrating a position sensor assembly of the CVD apparatus according to the present invention.

As shown in FIG. 8, at a side of the rotational shaft 330 is mounted the position sensor assembly 320 including a disc-like orientational position-indicating member 321 for indicating the orientational position of the heater H when rotating and an orientational position-recognizing sensor 322 for recognizing the orientational position of the heater H indicated by the position-indicating sensor 321.

In this manner, after the orientational position of the heater H at the start of the deposition process has been recognized by the position sensor assembly 320, the rotation of the heater H is stopped at the start orientational position of the heater H in the deposition process so that the wafer W on the heater H is oriented in the same direction as direction oriented at the start of the deposition process at the end of the deposition process.

In the meantime, the position sensor assembly 320 can be configured by a light-emitting diode (LED) and a photo diode. That is, after slits have been formed on the orientational position-indicating member, light is emitted from the light-emitting diode so as to pass therethrough. At this time, the light emitted from the light-emitting diode is recognized by the photo diode. Thus, after the orientational position of the wafer W when the light from the light-emitting diode reaches the slits of the position sensor assembly 320 is set as a start position, when the slits return to their original orientational positions at the end of the deposition process and then the light from the LED passing through the slits is sensed by the photo diode, it can be seen that the wafer W returns to its original orientational position.

Further, the position sensor assembly 320 may employ a magnet sensor. That is, after a magnet is mounted on the orientational position-indicating member 321, the current induced by the magnet may be measured to sense the orientational position of the wafer W.

In the meantime, the position sensor assembly 320 may employ an infrared sensor. That is, after the position where light emitted from the infrared sensor is interrupted is set as an original orientational position of the wafer W, when the re-interruption of the infrared light from the infrared sensor is sensed, it can be seen that the wafer W returns to its original orientational position.

Under the above construction of the position sensor assembly, the orientational positions of the wafer W at the start and the end of the deposition process can be set to be identical to each other.

A system and method for controlling the orientational positions of the wafer W at the start and the end of the deposition process will be described hereinafter with reference to FIG. 9.

Figure 9:
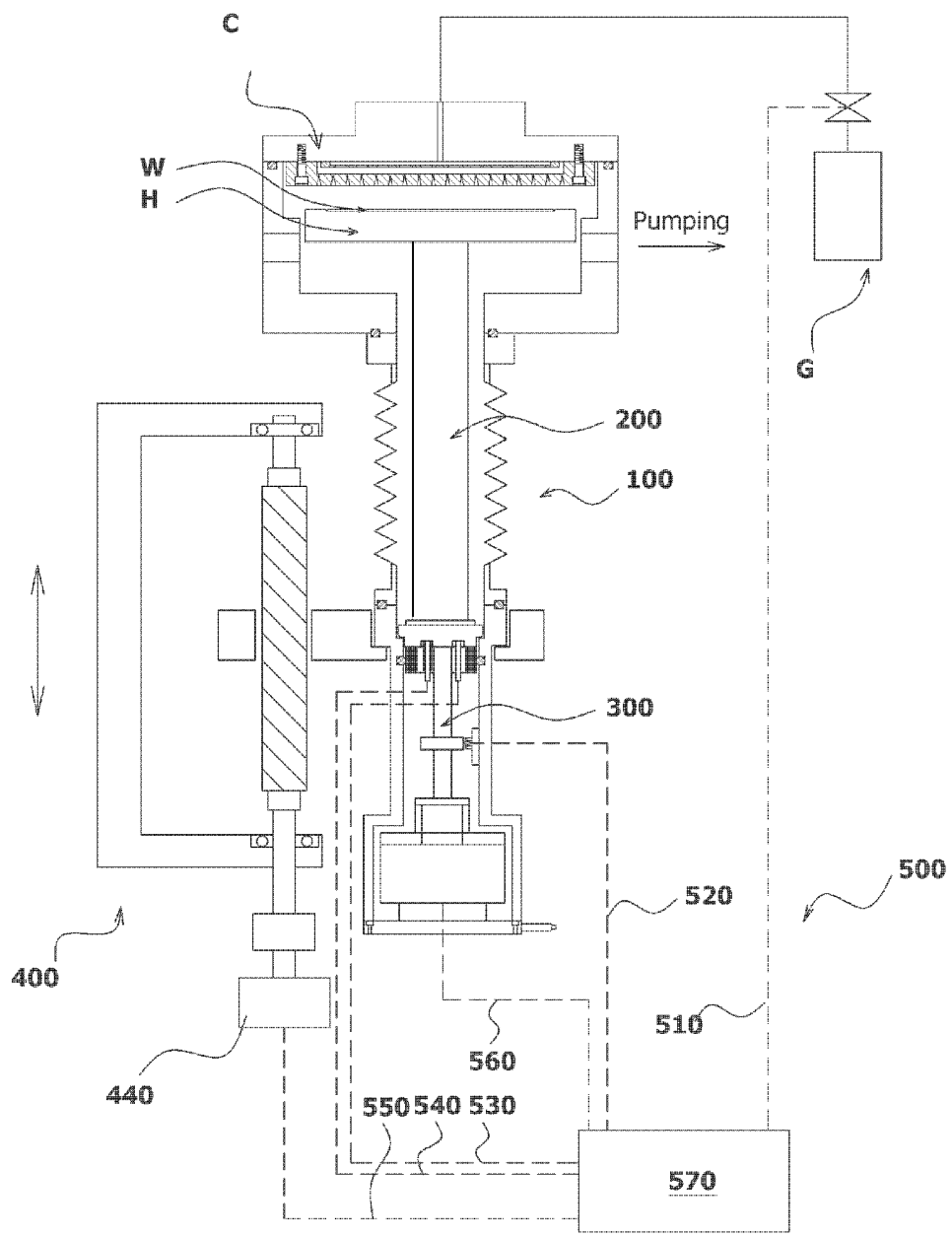
FIG. 9 is a conceptual view illustrating the control construction of the CVD apparatus according to the present invention.

Referring to FIG. 9, there is shown a control system 500 including a gas-controlling section 510 for controlling the supply of gas, a position sensor controlling section 520 for receiving a signal indicative of information on the orientational position of the wafer W on the heater H from the position sensor assembly 320, a heater-controlling section 530, a heater power supply 540, a feed motor-controlling section 550 for controlling the feed motor 440, and a motor-controlling section 560 for controlling the motor 310 for rotating the heater H.

A deposition process required by the control system is carried out.

Now, a method of controlling a chemical vapor deposition (CVD) apparatus according to the present invention using the control system 500 will be described hereinafter with reference to FIG. 10.

Figure 10:
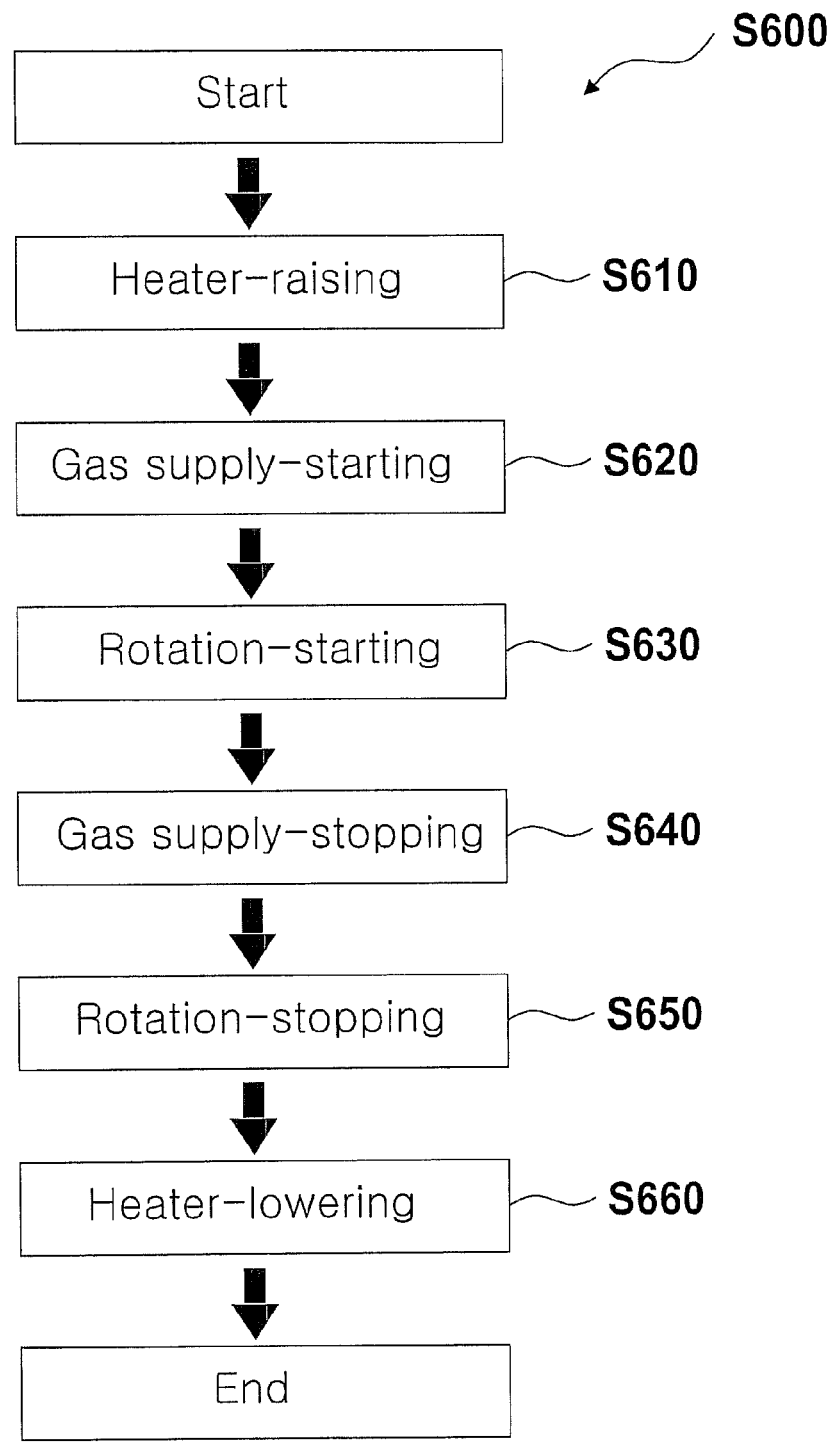
FIG. 10 is a flow chart illustrating a process of controlling the CVD apparatus to perform a deposition process using the CVD apparatus according to the present invention.

Referring to FIG. 10, first, at a heater-raising step S610, when initiating the deposition process, the central processing unit (CPU) 570 transmits a control signal to the feed motor 440 to cause a rotational force from the feed motor to be transferred to the feed screw 420 so as to upwardly move the feed plate 430 to raise the heater H. Thereafter, at a gas supply-starting step S620, the CUP 570 transmits a control signal to the gas-controlling section 510 to cause a gas supply portion G to supply gas. Then, at a rotation-starting step S630, the CPU 570 transmits a control signal to the motor-controlling section 560 to rotate the heater H. At this time, the deposition process is performed while the heater H rotates.

Referring to FIG. 10, first, at a heater-raising step S610, when initiating the deposition process, the central processing unit (CPU) 570 transmits a control signal to the feed motor 440 to cause a rotational force from the feed motor to be transferred to the feed screw 420 so as to upwardly move the feed plate 430 to raise the heater H. Thereafter, at a gas supply-starting step S620, the CUP 570 transmits a control signal to the gas-controlling section 510 to cause a gas supply portion G to supply gas. Then, at a rotation-starting step S630, the CPU 570 transmits a control signal to the motor-controlling section 560 to rotate the heater H. At this time, the deposition process is performed while the heater H rotates.

Thereafter, at an orientational position-confirming and rotation-stopping step S650, the CPU 579 receives a control signal from the position sensor-controlling section 520 to confirm whether the heater H is placed in the orientational position at the start of the deposition process, and then transmits a control signal to the motor-controlling section 560 to cause the motor-controlling section 560 to stop the rotation of the heater H if the heater H is placed in the orientational position at the start of the deposition process.

Thereafter, at an orientational position-confirming and rotation-stopping step S650, the CPU 579 receives a control signal from the position sensor-controlling section 520 to confirm whether the heater H is placed in the orientational position at the start of the deposition process, and then transmits a control signal to the motor-controlling section 560 to cause the motor-controlling section 560 to stop the rotation of the heater H if the heater H is placed in the orientational position at the start of the deposition process.

Then, lastly, at a heater-lowering step S660, the CPU 570 transmits a control signal to the feed motor controlling section 550 to cause the feed motor 440 to transfer a counter-rotational force to the feed screw 420 to cause the feed plate 430 to be downwardly moved to lower the heater H. Therefore, a series of control process of the CVD apparatus is completed.

Then, lastly, at a heater-lowering step S660, the CPU 570 transmits a control signal to the feed motor controlling section 550 to cause the feed motor 440 to transfer a counter-rotational force to the feed screw 420 to cause the feed plate 430 to be downwardly moved to lower the heater H. Therefore, a series of control process of the CVD apparatus is completed.

That is, it is efficient in terms of stability of the apparatus and prevention of erroneous operation that the heater H is accelerated gradually from a lower speed to a higher speed when the heater H starts to rotate.

In addition, at the end of the deposition process, the heater H is decelerated at a constant rate to be stopped, but is not instantaneously stopped, which helps to confirm whether the heater H is placed in the orientational position at the start of the deposition process when being stopped.

INDUSTRIAL APPLICABILITY

As described above, the inventive chemical vapor deposition (CVD) apparatus has advantageous effects in that it includes a motor for rotating the heater and a position sensor assembly for detecting the orientational position of the heater, so that the thickness of a thin film being deposited on a wafer can be made uniform through the rotation of the heater upon the deposition in spite of uneven introduction of a reaction gas into a reaction chamber, and the orientational positions of the wafer at the start and the end of the deposition process which are identical to each other can be secured.

Further, the orientational positions of the wafer are identical to each other at the start and the end of the deposition process to thereby orient the wafer in a predetermined direction on the heater.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A chemical vapor deposition (CVD) apparatus, comprising
    a reaction chamber where a deposition space of a wafer is provided;
    a chamber-supporting portion for supporting the reaction chamber;
    a shower head for injecting a reaction gas into the reaction chamber;
    a rotating heater disposed within the reaction chamber for heating a wafer seated thereon;
    a heater-supporting portion for supporting the rotating heater;
    a motor for generating a rotational force to rotate the rotating heater;
    a rotational shaft for transferring the rotational force generated from the motor;
    a rotational stand mounted on a top end of the rotational shaft for receiving the rotational force from the rotational shaft to rotate the heater, the heater-supporting portion being mounted on the rotational stand and being supported by the rotational stand, the rotational stand is mounted on the rotational shaft and is supported by the rotational shaft, wherein the rotational force from the motor is transferred to the rotational shaft, and the heater-supporting portion and the rotational stand are rotated by the rotational shaft;
    a rotation seal shaft mounted at a bottom surface of the rotational stand and having a cylindrical shape, wherein the rotational shaft is inserted into the rotation seal shaft to connect to the rotational stand;
    a seating portion retained in a feed plate of a feeding portion such that the seating portion moves upwardly with the feed plate and moves downwardly with the feed plate;
    a lower support at a bottom surface of the seating portion, wherein the motor, the rotational shaft and the rotation seal shaft are installed in the lower support such that the rotational force from the motor is not provided to the lower support; and
    an air-tight sealing member between the rotation seal shaft and the lower support so as to maintain air-tightness.

2. The chemical vapor deposition (CVD) apparatus as defined in claim 1, wherein the chamber-supporting portion comprises:
    a bellows adapted to be elastically length-adjusted correspondingly to a variation in a vertical moving length of the rotating heater depending on a raising or a lowering of the rotating heater;
    a connecting portion disposed between the reaction chamber and the bellows;
    the seating portion mounted at a bottom surface of the bellows and retained in the feed plate of the feeding portion so that the seating portion moves upwardly and downwardly with the feed plate;
    the lower support; and
    the air-tight sealing member.

3. The chemical vapor deposition (CVD) apparatus as defined in claim 2, wherein the rotation seal shaft rotates while abutting against the air-tight sealing member so as to maintain air-tightness.

4. The chemical vapor deposition (CVD) apparatus as defined in claim 2, wherein the air-tight sealing member is a quad ring.

5. The chemical vapor deposition (CVD) apparatus as defined in claim 2, wherein the rotation seal shaft is made of any one selected from the group consisting of Polytetrafluoroethylene (PTFE), Polyetheretherketone (PEEK), stainless steel and aluminum.

6. The chemical vapor deposition (CVD) apparatus as defined in claim 1, further comprising:
    a position sensor assembly mounted at a side of the rotational shaft, and the position sensor assembly including a disc-like orientational position-indicating member for indicating an orientational position of the rotating heater when rotating and an orientational position-recognizing sensor for recognizing the orientational position of the rotating heater indicated by the position-indicating sensor.

7. A chemical vapor deposition apparatus, comprising
    a reaction chamber;
    a chamber-supporting portion to support the reaction chamber;
    a rotating heater within the reaction chamber;
    a heater-supporting portion to support the rotating heater;
    a motor to generate a rotational force;
    a rotational shaft to rotate based on the rotational force from the motor;
    a rotational stand on a top of the rotational shaft to rotate with the rotational shaft and thereby rotate the rotating heater, the heater-supporting portion being provided on the rotational stand and being supported by the rotational stand, the rotational stand is mounted on the rotational shaft and is supported by the rotational shaft, wherein the rotational force from the motor is transferred to the rotational shaft, and the heater-supporting portion and the rotational stand are rotated by the rotational shaft;
    a rotation seal shaft at a bottom of the rotational stand and having a cylindrical shape, the rotational shaft being inserted into the cylindrical shape of the rotation seal shaft to couple to the rotational stand;
    a seating portion retained in a feed plate of a feeding portion such that the seating portion moves upwardly with the feed plate and moves downwardly with the feed plate;
    a lower support at a bottom surface of the seating portion, wherein the motor, the rotational shaft and the rotation seal shaft are installed in the lower support such that the rotational force from the motor is not provided to the lower support; and
    an air-tight sealing member between the rotation seal shaft and the lower support so as to maintain air-tightness.

8. The chemical vapor deposition apparatus as defined in claim 7, wherein the chamber-supporting portion comprises:
    a bellows that adjusts a length to correspond to a variation in a movement of the rotating heater based on a raising of the rotating heater or a lowering of the rotating heater;

a connecting portion between the reaction chamber and the bellows;

the seating portion at a bottom of the bellows and provided in the feed plate such that the seating portion moves upwardly with the feed plate or moves downwardly with the feed plate;

the lower support; and the air-tight sealing member.

9. The chemical vapor deposition apparatus as defined in claim 8, wherein the rotation seal shaft abuts against the air-tight sealing member while rotating and maintains air-tightness.

10. The chemical vapor deposition apparatus as defined in claim 8, wherein the air-tight sealing member is a quad ring.

11. The chemical vapor deposition apparatus as defined in claim 8, wherein the rotation seal shaft is made of any one selected from the group consisting of Polytetrafluoroethylene (PTFE), Polyetheretherketone (PEEK), stainless steel or aluminum.

12. The chemical vapor deposition apparatus as defined in claim 7, further comprising:

a position sensor assembly at a side of the rotational shaft, the position sensor assembly including a disc-like orientational position-indicating member for indicating an orientational position of the rotating heater and an orientational position-recognizing sensor for recognizing the orientational position of the rotating heater indicated by the position-indicating sensor.

* * * * *